United States Patent [19]

Corrie et al.

[11] Patent Number: 4,892,842
[45] Date of Patent: Jan. 9, 1990

[54] METHOD OF TREATING AN INTEGRATED CIRCUIT

[75] Inventors: Brian L. Corrie, Gaston; Morley M. Blouke, Beaverton; Denis L. Heidtmann, Portland, all of Oreg.

[73] Assignee: Tektronix, Inc., Beaverton, Oreg.

[21] Appl. No.: 114,884

[22] Filed: Oct. 29, 1987

[51] Int. Cl.⁴ .................. H01L 21/76; H01L 21/82
[52] U.S. Cl. .................................... 437/67; 437/68; 437/53; 437/209; 437/974
[58] Field of Search ............... 437/209, 86, 974, 67, 437/68, 228

[56] References Cited

U.S. PATENT DOCUMENTS

| | | | |
|---|---|---|---|
| 3,508,980 | 4/1970 | Jackson, Jr. et al. | 437/962 |
| 3,623,219 | 11/1971 | Stoller et al. | 437/974 |
| 3,665,263 | 5/1972 | Akyama | 317/235 R |
| 3,875,657 | 4/1975 | Clarke et al. | 437/974 |
| 3,911,559 | 10/1975 | Beam et al. | 437/86 |
| 4,050,979 | 9/1977 | Smeltzer et al. | 437/974 |
| 4,106,046 | 8/1978 | Nathanson et al. | 357/30 |

FOREIGN PATENT DOCUMENTS

| | | | |
|---|---|---|---|
| 0001707 | 10/1978 | European Pat. Off. | |
| 2025015 | 12/1969 | France | |
| 0030284 | 3/1978 | Japan | 437/974 |
| 0165737 | 8/1985 | Japan | 437/974 |
| 0008940 | 1/1986 | Japan | 437/86 |
| 0059824 | 3/1986 | Japan | 437/974 |
| 0296736 | 12/1986 | Japan | 437/974 |
| 2137807 | 10/1984 | United Kingdom | 437/209 |

OTHER PUBLICATIONS

IBM Technical Disclosure Bulletin, "Method of Evenly Filling Isolation Trenches", J. Greschner, B. F. Hafner and H. J. Trumpp, vol. 27, No. 4A, Sep. 1984.

Primary Examiner—Olik Chaudhuri
Attorney, Agent, or Firm—John D. Winkelman; John Smith-Hill

[57] ABSTRACT

An integrated circuit formed in a semiconductor die which has at least two distinct functional regions is treated by mounting the die by way of its front face on a support member, and subsequently removing die material by way of its back face so as to physically separate the functional regions of the die from each other.

11 Claims, 1 Drawing Sheet

METHOD OF TREATING AN INTEGRATED CIRCUIT

BACKGROUND OF THE INVENTION

This invention relates to a method of treating an integrated circuit.

A charge-coupled device (CCD) may be made by processing a silicon wafer of p conductivity using conventional MOS technology to form a plurality of buried channels of n conductivity beneath the front surface of the wafer (the surface through which the wafer is processed). Each channel is made up of a linear array of like elementary zones. A clocking electrode structure overlies the front surface of the wafer, and by application of selected potentials to the clocking electrode structure, charge present in a given elementary zone of a channel may be advanced through the linear array of elementary zones, in the manner of a shift register, and extracted from the channel. Charge may be generated in the channels photoelectrically. Thus, if electromagnetic radiation enters the wafer it may cause generation of conduction electrons and these conduction electrons may become confined in one of the elementary channel zones.

A known type of CCD has three distinct functional components formed in different regions of a single silicon die. The buried channels are formed in a channel region. In operation, the channel region is clocked between voltages of approximately 7-15 volts relative to the substrate, which is typically held at 0 volts. Charge that is propagated to the output ends of the buried channels is applied to an output amplifier which is formed in an amplifier region of the CCD. The output amplifier normally includes at least one field effect transistor. In the known type of CCD the substrate bias in the amplifier region is the same as that in the channel region.

The field effect transistor of the output amplifier is generally operated with a large potential difference between the source and substrate and between the drain and substrate. This is required because the gate of the output transistor is connected to an output diode which is required to operate at a voltage of the order of 15 V. The large drain to substrate voltage causes the transistor to operate in an undesirable fashion. First, the large reverse bias on the drain causes light emission to occur from the junction. This light may propagate through the die of the known type of CCD and result in generation of conduction electrons in the buried channels, thus adding noise to the signals received by the output amplifier from the buried channels. Second, the large drain to substrate bias forces the transistor, which is normally of the buried channel type, to operate in the surface channel mode. That is, the conduction channel, which normally would reside away from the silicon/silicon dioxide interface, is forced to the surface. This contributes additional noise to the output signal.

It is known to use a level shifting amplifier to couple useful signal information from a first circuit node at a first potential to a second circuit node at a second potential. However, it would not be practicable to use a level shifting amplifier to couple the output diode of a CCD to the gate of the output field effect transistor, because it would be the first amplifier in a chain of amplifiers and would inevitably introduce substantial noise into the output signal provided by the amplifier chain. The clock electrodes of the CCD are connected to clock drivers, which may be formed in a clock driver region of the wafer. The clock drivers are used to change the potentials of the clock electrodes at a high frequency, and therefore rapidly changing electric fields are generated by the clock drivers. In the known type of CCD, these fields are coupled through the die to the channel region, and influence the quantity of charge confined in the buried channels.

A CCD may be used to generate a two-dimensionally sampled electrical signal representative of the distribution of light intensity over the channel region of the CCD. In such an imaging CCD, it is desirable that the thickness of the die be not much greater than the depth of the interface between the channels and the substrate. This may be achieved by securing the wafer at its front surface to a reinforcing member, and thinning the wafer from its back surface.

SUMMARY OF THE INVENTION

A preferred embodiment of the present invention in its first aspect is a method of treating an integrated circuit formed in a semiconductor die having a front surface and a back surface, the die having at least two distinct functional regions, comprising the steps of mounting the die by way of its front surface on a support member, and subsequently removing die material by way of the back surface so as to physically separate the functional regions of the die from each other.

A preferred embodiment of the present invention in its second aspect is an integrated circuit which comprises a semiconductor die having front and back surfaces, the die having at least two distinct functional regions, and a support member attached to the front surface of the die, the different functional regions of the die being electrically isolated from each other.

BRIEF DESCRIPTION OF THE DRAWINGS

For a better understanding of the invention, and to show how the same may be carried into effect, reference will now be made, by way of example, to the accompanying drawings in which.

DETAILED DESCRIPTION

Figure 1:
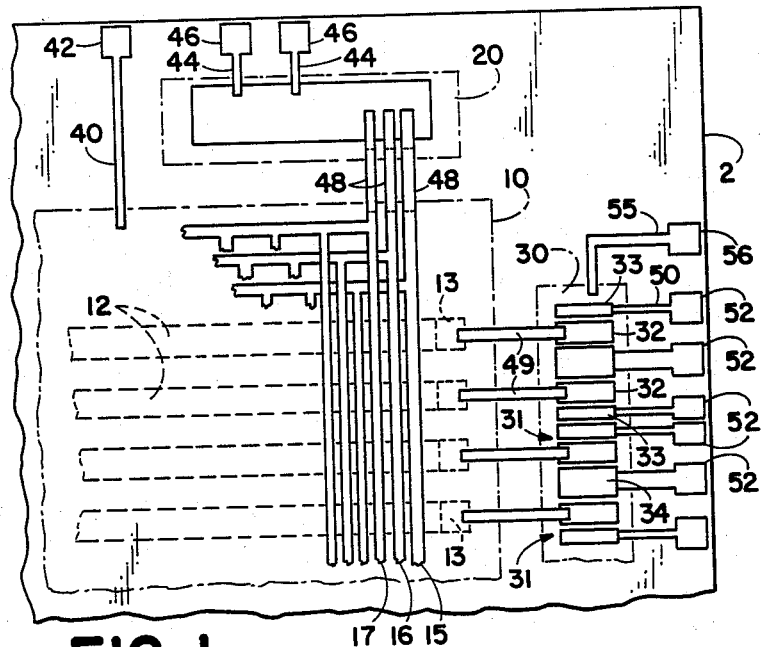
FIG. 1 is a diagrammatic view of the front surface of an imaging CCD.
Figure 2A:
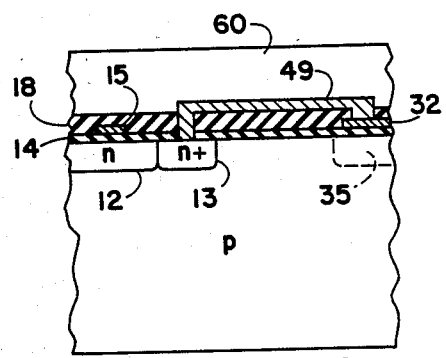
FIGS. 2A and 2B are partial sectional views of one part of the CCD at two stages in the fabrication thereof.
Figure 3A:
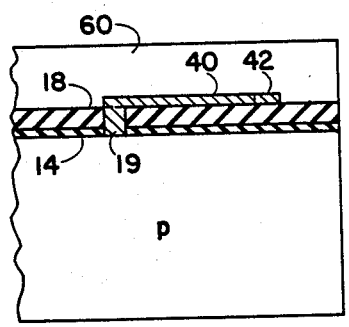
FIGS. 3A and 3B are partial sectional views of another part of the CCD at the two fabrication stages shown in FIGS. 2A and 2B respectively.

The CCD illustrated in FIG. 1 comprises a monocrystalline die 2 of p conductivity having three distinct functional regions, namely, a channel region 10, a clock driver region 20, and an output amplifier region 30. In the channel region 10, multiple parallel buried channels 12 of n conductivity are formed in the die. Each channel 12 ends in a floating diffusion 13 of n+ conductivity, which is also shown in FIG. 2A. A layer 14 (FIG. 2A) of thermally-grown silicon dioxide covers the buried channels 12. Three arrays of polysilicon clock electrodes 15, 16 and 17 (FIG. 1) extend over the silicon dioxide layer 14, perpendicular to the buried channels 12, and a further layer 18 (FIG. 2A) of silicon dioxide, formed by a reflow operation, covers the clock electrode arrays. Ohmic contact is made to the die 2 inside the channel region 10 by a metal electrode 19 (FIG. 3A). A metal interconnect strip 40 connects the electrode 19 to a bonding pad 42 which, as shown in FIG. 1, lies outside the channel region 10.

The clock driver region 20 contains, integrated in the die, a circuit having input terminals which are connected by metal interconnect strips 44 (FIG. 1) to bonding pads 46, which lie outside the clock driver region 20, for connection to a power supply. The circuit also has output terminals connected to the clock electrode arrays 15, 16, and 17 respectively by metal interconnect strips 48.

The output amplifier region 30 contains field effect transistors 31 of which the polysilicon gates 32, shown also in FIG. 2A, are connected by metal interconnect strips 49 to the floating diffusions 13 of the channels respectively. Each field effect transistor 31 has a source electrode 33, and pairs of adjacent FETs share a common drain electrode 34. A source diffusion 35, which lies out of the plane of FIG. 2A, is shown in dashed lines in FIG. 2A. The source and drain electrodes 33 and 34 are connected by metal interconnect strips 50 to respective metal bonding pads 52 outside the amplifier region 30. Ohmic contact is made to the die 2 inside the amplifier region 30 by a metal electrode (not shown) which is connected by a metal interconnect strip 55 to a bonding pad 56 which lies outside the region 30.

The interconnect strips 40, 44, 48, 49, 50 and the bonding pads 42, 46, 53 are deposited on top of the silicon dioxide layer 18.

Figure 2B:
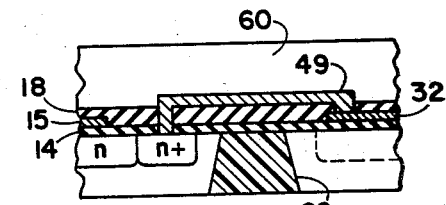
Figure 3B:
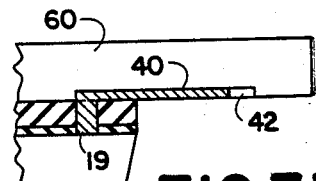

A layer 60 (FIGS. 2 and 3) of high silica borosilicate glass is formed on top of the front surface of the die, and the die is thinned from its back surface to a thickness of about 10-20 μm. The borosilicate glass, which bonds firmly to the metal interconnect strips and bonding pads as well as to the silicon dioxide layer 18, reinforces the thinned substrate. The use of borosilicate glass as a reinforcing material for thinned CCDs is described in copending Patent Application Ser. No. 07/018,832 filed Feb. 24, 1987.

Using conventional photoprocessing techniques, the die is selectively etched from the back surface to the level of the silicon dioxide layer 14, to divide the die into three distinct portions, corresponding to the channel region 10, the clock driver region 20 and the output amplifier region 30 respectively. The etchant does not attack silicon dioxide, and therefore the layer 14 remains intact. Preferably, a crystalline etch is performed, in which the etchant attacks the crystal planes parallel to the front surface of the die more strongly than it does other crystal planes. For example, if, as is conventional in fabrication of integrated circuits, the front surface is parallel to the 100 crystal plane, ethylene diamine pyrocatechol may be used as the etchant. A second etching operation is then carried out, using an etchant that attacks silicon dioxide but does not attack silicon or the metal employed for the interconnect strips and the bonding pads. In this second etching operation, the silicon dioxide of the layers 14 and 18 is removed where it covers the bonding pads 42. In this manner, the bonding pads are exposed. However, the oxide that covers the interconnect strips connecting the various regions of the die is masked so that the interconnect strips are not exposed. The etchant employed in the second etching operation attacks the material of the layer 60, but by controlling the time of the second etching operation removal of excessive material can be avoided. By thus dividing the die into discrete portions, corresponding respectively to the functional regions of the die, it becomes possible to employ different substrate bias voltages for the output amplifier region and for the channel region respectively. Similarly, the rapidly changing fields in the clock driver region are not coupled through the die to the channel region. Light generated by operation of the transistors in the output amplifier region and the clock driver region is not propagated so readily to the channel region, due to reflection and scattering at the walls of the trenches formed by etching. In any event, an optically opaque dielectric material 66 (FIG. 2B), such as a synthetic polymer material, may be placed in the trenches to ensure that no light would be propagated to the channel region from the output amplifier region or the clock driver region.

It will be appreciated that the present invention is not restricted to the particular embodiment that has been described and illustrated, and that variations may be made therein without departing from the scope of the invention as defined in the appended claims and equivalents thereof. For example, the invention is not limited to use with charge coupled devices. In advanced CMOS technology, in which diffusions are formed in a very thin epitaxial layer that has been grown on a monocrystalline wafer, the front surface of the epitaxial layer may be attached to a support member and the wafer on which the epitaxial layer was grown may be removed by etching. Different regions of the epitaxial layer may be separated from each other by trenches formed in the manner described with reference to FIG. 2. Moreover, the invention is not limited to use with any particular material for the support member. It is necessary only that the coefficient of thermal expansion of the material of the support member match closely that of the wafer. Accordingly, in the case of a silicon wafer it is generally desirable that the material of the support member have a high silicon content.

We claim:

1. A method of treating an integrated circuit formed in a semiconductor die having a front face and a back face, the die having at least two distinct functional regions that are electrically connected together, comprising the steps of:

mounting the die by way of its front face on a support member, and removing material of the die by way of the back face so as to separate the functional regions of the die from each other without disconnecting the functional regions from each other.

2. A method according to claim 1, wherein the step of removing material of the die comprises selectively etching the die by way of its back face.

3. A method according to claim 1, wherein the die has a layer of dielectric material adhered to its front face and the support member is adhered to the layer of dielectric material, and the step of removing material of the die comprises etching the material of the die with an etchant that does not attack the dielectric material.

4. A method of treating an integrated circuit formed in a semiconductor die having a front face and a back face, the die having at least two distinct functional regions that are electrically connected together and a peripheral region that surrounds the functional regions, the die having a layer of dielectric material adhered to its front face, wherein the method comprises the steps of:

forming metal bonding portions on the layer of dielectric material, said bonding portions extending at least partially over the peripheral region of the die, adhering a support member to the layer of dielectric material and said bonding portions, selectively etching the die by way of its back face with an etchant that does not attack the dielectric material, so as to separate the functional regions of the die from each other without disconnecting the functional regions electrically from each other, and removing material of the peripheral region of the die so as to expose the portion of the layer of dielectric material over the peripheral region of the die and removing the exposed portion of the layer of dielectric material so as to expose the bonding portions.

5. A method according to claim 1, wherein the step of removing material of the die results in formation of a trench between the functional regions of the die, and the method further comprises placing optically opaque dielectric material in the trench.

6. A method of treating an integrated circuit formed in a semiconductor die having a front face and a back face, at least two distinct functional regions, a peripheral region surrounding the functional regions, and a layer of dielectric material adhered to its front face, said method comprising the steps of:

forming metal bonding portions on the layer of dielectric material, said bonding portions extending at least partially over the peripheral region of the die, mounting the die by way of its front face on a support member that adheres to the layer of dielectric material and the bonding portions, removing material of the die by way of the back face so as to separate the functional regions of the die from each other and expose the layer of dielectric material over the peripheral region, and removing exposed dielectric material so as to expose the bonding portions.

7. A method according to claim 6, wherein the step of removing material of the die comprises selectively etching the die.

8. A method according to claim 7, wherein the step of removing material of the die comprises etching the material of the die with an etchant that does not attack the dielectric material.

9. A method according to claim 6, wherein the step of removing material of the die results in formation of a trench between the functional regions of the die, and the method further comprises placing optically opaque dielectric material in the trench.

10. A method of treating an integrated circuit formed in a semiconductor die having a front face and a back face and having a layer of dielectric material adhered to its front face, the die having at least two distinct functional regions in which circuits for performing different functions are formed, the two distinct regions of the die being spaced apart from one another and being electrically interconnected by at least one strip of conductive material on the layer of dielectric material, and the die also having a peripheral region that surrounds the functional regions, the method comprising the steps of:

(a) forming at least one metal bonding portion on the layer of dielectric material, said bonding portion being connected to one of the functional regions and extending over the peripheral region of the die, (b) adhering the layer of dielectric material to a support member, whereby the die is mounted on the support member, (c) etching the die by way of the back face so as to separate the functional regions of the die from each other, using an etchant that does not attack the dielectric material, whereby the dielectric material masks the strip of conductive material from the etchant and the functional regions remain electrically interconnected, (d) removing material of the peripheral region of the die by way of the back face, so as to expose the portion of the layer of dielectric material over the peripheral region of the die, and (e) removing the dielectric material exposed in step (d) so as to expose the bonding portion.

11. A method according to claim 10, wherein step (c) results in formation of a trench between the functional regions of the die, and the method further comprises:

(f) placing optically opaque material in the trench.

* * * * *